(12) United States Patent
Zhu et al.

(10) Patent No.: US 7,229,866 B2
(45) Date of Patent: Jun. 12, 2007

(54) NON-ACTIVATED GUARD RING FOR SEMICONDUCTOR DEVICES

(75) Inventors: Ting Gang Zhu, Somerset, NJ (US); Bryan S. Shelton, Bound Brook, NJ (US); Alex D. Ceruzzi, Princeton, NJ (US); Linlin Liu, Hillsborough, NJ (US); Michael Murphy, Somerset, NJ (US); Milan Pophristic, North Brunswick, NJ (US)

(73) Assignee: Velox Semiconductor Corporation, Somerset, NJ (US)

( * ) Notice: Subject to any disclaimer, the term of this patent is extended or adjusted under 35 U.S.C. 154(b) by 21 days.

(21) Appl. No.: 10/935,000

(22) Filed: Sep. 7, 2004

(65) Prior Publication Data

US 2005/0202661 A1    Sep. 15, 2005

(51) Int. Cl.
    *H01L 21/338*    (2006.01)
(52) U.S. Cl. ..................................... 438/167
(58) Field of Classification Search ............... 257/280, 257/484; 438/167, 570
    See application file for complete search history.

(56) References Cited

U.S. PATENT DOCUMENTS

| | | | |
|---|---|---|---|
| 5,478,764 A * | 12/1995 | Inoue | 438/530 |
| 5,686,738 A | 11/1997 | Moustakas | |
| 5,741,724 A | 4/1998 | Ramdani et al. | |
| 5,785,606 A | 7/1998 | Marquez | |
| 5,874,747 A | 2/1999 | Redwing et al. | |
| 6,121,121 A | 9/2000 | Koide | |
| 6,139,628 A | 10/2000 | Yuri et al. | |
| 6,146,457 A | 11/2000 | Solomon | |
| 6,707,128 B2 * | 3/2004 | Moriguchi et al. | 257/484 |
| 6,825,073 B1 * | 11/2004 | Wu | 438/167 |
| 6,900,483 B2 * | 5/2005 | Uchida et al. | 257/280 |
| 2003/0062525 A1 * | 4/2003 | Parikh et al. | 257/73 |

FOREIGN PATENT DOCUMENTS

| | | |
|---|---|---|
| EP | 0514018 A2 | 4/1992 |
| JP | 11040847 | 2/1999 |
| JP | 11145514 | 5/1999 |
| WO | WO-96/41906 | 12/1996 |
| WO | WO-01/43174 A2 | 6/2001 |

OTHER PUBLICATIONS

Development of GaN-Based Electronic Device on Si, by Masataka Yanagihara and Shinichi Twakami.

* cited by examiner

*Primary Examiner*—Calvin Lee
(74) *Attorney, Agent, or Firm*—Lowenstein Sandler PC (57) ABSTRACT

A guard ring is formed in a semiconductor region that is part of a Schottky junction or Schottky diode. The guard ring is formed by ion implantation into the semiconductor contact layer without completely annealing the semiconductor contact layer to form a high resistance region. The guard ring may be located at the edge of the layer or, alternatively, at a distance away from the edge of the layer. A Schottky metal contact is formed atop the layer, and the edges of the Schottky contact are disposed atop the guard ring.

12 Claims, 12 Drawing Sheets

NON-ACTIVATED GUARD RING FOR SEMICONDUCTOR DEVICES

BACKGROUND OF THE INVENTION

The present invention is directed to semiconductor devices and, more particularly, to semiconductor devices which incorporate a metal-to-semiconductor rectifying junction, such as Schottky diodes.

Semiconductor devices having a metal-to-semiconductor rectifying junction, known as a Schottky junction, are desirable for many applications. As an example, diodes having such a junction, known as Schottky diodes, are desired for applications where energy losses while switching from forward bias to reverse bias and back can significantly impact the efficiency of a system and where high current conduction is desired under forward bias and little or no conduction is desired under reverse bias, such as when used as an output rectifier in a switching power supply. The Schottky diodes have lower turn-on voltages because of the lower barrier height of the rectifying metal-to-semiconductor junction and have faster switching speeds because they are primarily majority carrier devices.

The rectifying properties of the metal-to-doped semiconductor junction results from a contact potential difference that is based on the difference in the respective work functions of the contacting metallic layer and semiconductor body as well as on the semiconductor surface states. When the device is forward biased, the contact potential difference is overcome and the device conducts. By contrast, when the device is reverse biased, little or no current flows in the reverse direction. However, the applied reverse bias voltage can create high electric fields in the semiconductor body regions near the edge of the metallic contact, resulting in leakage current. Further, when the reverse bias voltage is sufficiently high, the high field concentration increases and may result in avalanche breakdown in the device.

To reduce the edge effects of the reverse biased Schottky contact, a guard ring may be formed in the semiconductor body in the region beneath the edge of the metallic contact. The guard ring is typically a region of conductivity type opposite to that of the semiconductor body which reduces the electric field near the edge of the metallic contact and reduces the radius of curvature effects at these edges. As a result, the breakdown voltage of the Schottky barrier is raised and the leakage characteristics are improved so that the device is suitable for higher-voltage applications.

Typically, the guard ring is formed by ion implanting a dopant species into the semiconductor body where the dopant species is of opposite conductivity type to that of the semiconductor body. To incorporate the dopants into the semiconductor body, a high temperature anneal is carried out which causes implanted dopant atoms to be substituted for atoms of the semiconductor body at some of the locations in the crystal lattice. When the implanted dose is sufficiently high, the anneal causes the conductivity type of the implanted regions to be reversed. For some semiconductor materials such as nitride-based semiconductors, however, such a reversal is hard to achieve. Further, the annealing process damages the surface of the semiconductor body- and results in a poor contact between the metallic contact layer and the semiconductor.

It is therefore desirable to provide a guard ring for a semiconductor device having a Schottky junction without damaging the surface of the semiconductor.

SUMMARY OF THE INVENTION

A method of forming a guard ring in a semiconductor structure is in accordance with an aspect of the invention. A semiconductor body is provided that includes at least a contact layer. At least one ion species is implanted into at least one portion of the contact layer to form at least one implanted region therein. The implanted region is disposed at least adjacent to a portion of a surface of the contact upon which an edge of a Schottky metallic contact is disposed or is to be disposed. The semiconductor body is subsequently processed without completely annealing the implanted region.

A semiconductor structure is in accordance with another aspect of the invention. A semiconductor body includes at least one contact layer. At least one guard ring is formed in at least one portion of the contact layer. The guard ring includes an implanted region having at least one implanted ion species and that is disposed at least adjacent to a portion of a surface of the contact layer upon which an edge of a Schottky metallic contact is disposed. The implanted region is incompletely annealed.

In accordance with these aspects of the invention, the implanted region may adjoin the surface of the doped region. An end of the implanted region may adjoin the edge of the Schottky metallic contact. The end of the implanted region may be located at an edge of the contact layer. The implanted region may be located at least 1 μm away from an edge of the contact layer, and the implanted region may be located at most 10 μm away from the edge of the contact layer. The ion species may be implanted at a dose of at least 5E12 cm$^{-2}$ and may be implanted at a dose of at most 1E16 cm$^{-2}$. The ion species may be implanted at a zero tilt angle with respect to the surface of the doped region or may be implanted at a tilt angle of at most 14 degrees. A masking layer may be formed at least atop the surface of the doped region and then patterned to define at least one opening therein through which the ion species is implanted into the portion of the doped region.

At least one region of the semiconductor body may be patterned and etched prior to the further processing and may define a further surface in the semiconductor body and at least one mesa that projects upwardly from the further surface and that includes at least one part of the contact layer. The patterning and etching may be carried out prior to implanting the ion species, and the ion species may be implanted through a sidewall of the mesa. The implanting of the ion species may be carried out prior to the patterning and etching so that the patterning and etching removes a portion of the implanted region.

The contact layer may include a nitride-based semiconductor, a gallium nitride-based semiconductor, and/or GaN. The implanted region may be a completely unannealed region.

A Schottky junction may be formed in a semiconductor structure whereby a guard ring is formed in the semiconductor structure in accordance with the above aspects of the invention and a metallic contact layer is formed atop at least part of the contact layer to form a Schottky junction therewith.

A Schottky diode may be formed in accordance with the above aspects of the invention whereby at least one semiconductor layer is formed on a surface of a substrate and at least includes the contact layer, the semiconductor body includes a silicon substrate and the at least one semiconductor layer, and the Schottky diode further includes a metallic contact formed atop at least part of the contact layer to form a Schottky junction therewith. At least one further metallic contact may be formed on the contact layer in substantially ohmic contact therewith.

At least one region of the semiconductor layer may be patterned and etched prior to forming the metallic contact layer and may define at least one further surface of a semiconductor body and at least one mesa where the mesa projects upwardly from the further surface and at least includes the contact layer and the Schottky junction may be formed atop the mesa. The patterning and etching may be carried out prior to implanting the ion species. The further surface of the semiconductor body may be a lower contact surface, and at least one further metallic contact may be formed on the lower surface in substantially ohmic contact therewith.

One or more regions of the semiconductor body may be patterned and etched and may define a plurality of mesas projecting upwardly from the further surface with at least some of the mesas each including at least one guard ring. A plurality of metallic contacts, each disposed atop a respective one of the plurality of mesas and forming respective Schottky contacts with at least a top surface of that mesa, may be formed.

The substrate may be an electrically insulating material or may be a semiconductor. At least one further metallic contact may be formed on another surface of the substrate in substantially ohmic contact therewith.

A Schottky diode may be formed in accordance with the above aspects of the invention wherein at least one semiconductor layer is formed on a surface of a substrate and at least includes the contact layer, the semiconductor body includes the substrate and the at least one semiconductor layer, the Schottky diode further includes a metallic contact formed atop at least part of the contact layer prior to implanting the at least one ion species to form a Schottky junction therewith, and the metallic contact masks the implanting of at least one ion species such that the implanted region is self-aligned to the metallic contact.

At least one further metallic contact may be formed on the semiconductor layer in substantially ohmic contact therewith prior to implanting the at least one ion species and further masks the implanting of the ion species.

At least one region of the semiconductor layer may be patterned and etched prior to forming the metallic contact to define at least one lower contact surface in the semiconductor body and at least one mesa where the mesa projects upwardly from the further surface and at least includes the doped region, the Schottky contact formed atop the mesa, and at least one further metallic contact formed on the lower contact surface in substantially ohmic contact therewith prior to implanting the at least one ion species and further masks the implanting of the at least one ion species.

Yet another aspect of the invention includes a Schottky junction that is formed in accordance with the method described above.

Still another aspect of the invention includes a Schottky diode that is formed in the manner described above.

The foregoing aspects, features and advantages of the present invention will be further appreciated when considered with reference to the following description of the preferred embodiments and accompanying drawings.

DETAILED DESCRIPTION

Figure 1:
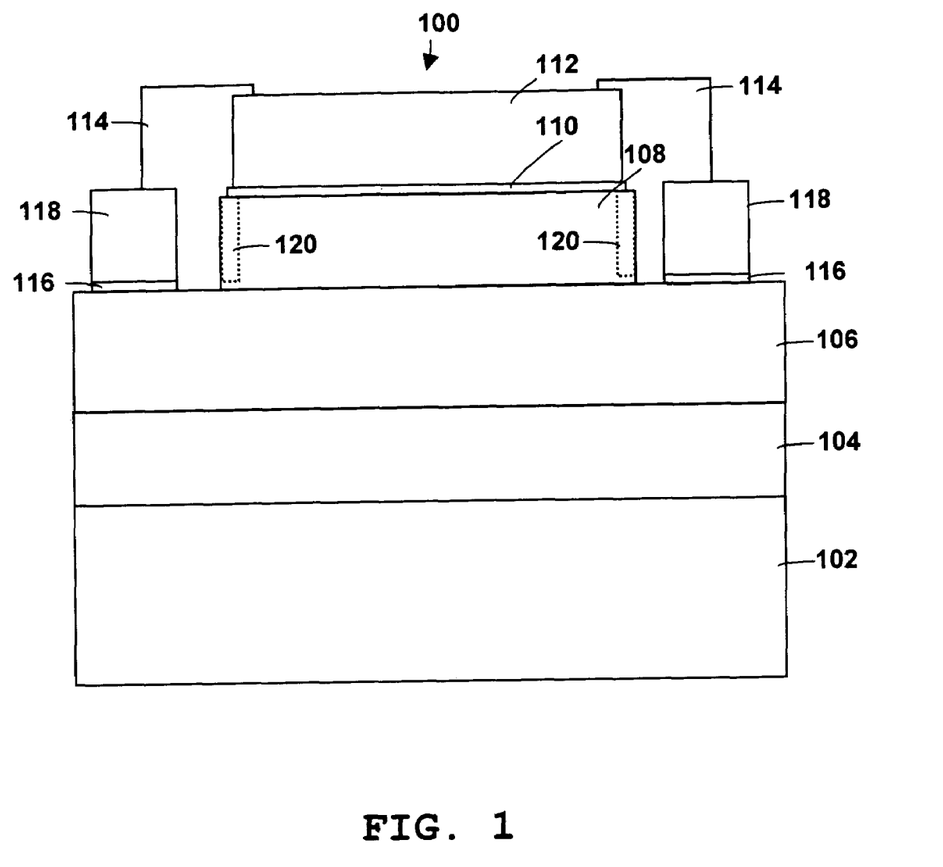
FIG. 1 is a fragmentary, diagrammatic cross-sectional view on an enlarged scale showing a laterally conducting Schottky diode in accordance with an embodiment of the invention.

FIG. 1 illustrates a cross-sectional view of a laterally conducting Schottky diode 100 in accordance with an embodiment of the invention. The Schottky diode includes an electrically insulating substrate 102 and, optionally, a buffer structure 104. A highly doped semiconductor layer 106 is disposed atop the buffer structure 104 or, when the buffer structure is not present, directly atop the substrate 102. A semiconductor contact layer 108, which may be a lower doped semiconductor layer or an unintentionally doped semiconductor layer and which is preferably in the shape of a mesa, is disposed atop a portion of the more highly doped semiconductor layer 106. A Schottky metal contact 110 is located atop the semiconductor contact layer 108 and forms a metal-to-semiconductor rectifying junction with the semiconductor layer 108. A thicker bond pad metal layer 112 is disposed atop the Schottky metal contact 110.

A guard ring 120 is formed within the semiconductor layer 108 and is located at or near the edge of the mesa. A portion of the guard ring may be disposed beneath the edge of the Schottky metal contact 110 such that a remaining portion of the guard ring is disposed outside of the metal contact. Alternatively, the entire guard ring is disposed outside of the metal contact 110 but is aligned to the edge of the metal contact and, preferably, adjoins the metal contact so that the guard ring is not laterally separated from the metal contact which would reduce the effectiveness of the guard ring.

The guard ring 120 serves to reduce the high electric fields located at the edges of the Schottky metal contact as well as reduce the leakage current that occurs when the device is reverse biased. The top surface of the guard ring 120 is located in close proximity to and, more preferably, at the Schottky barrier formed between the semiconductor layer 108 and the Schottky metal contact 110. The bottom of the guard ring is separated from the higher doped layer 106 by a portion of the semiconductor contact layer 108. The separation prevents the formation of a junction between the guard ring and the layer 106.

The guard ring is a high resistance region that is formed by implantation of one or more ion species into the semiconductor layer 108. The implanted ion species, however, are not activated during subsequent processing, such as by annealing, so that the surface charge introduced by the ion implant remains at the top surface of the layer 108.

An ohmic metal contact 116 is disposed atop a portion of the higher doped layer 106, and a thicker bond pad metal layer 118 is disposed atop the ohmic metal contact 116. A passivation layer 114 may be formed at least between the stacked structure formed by the ohmic metal contact 116 and bond pad layer 118 and the stacked structure formed by the semiconductor layer 108, Schottky metal contact 110 and bond pad metal layer 112.

Figure 2:
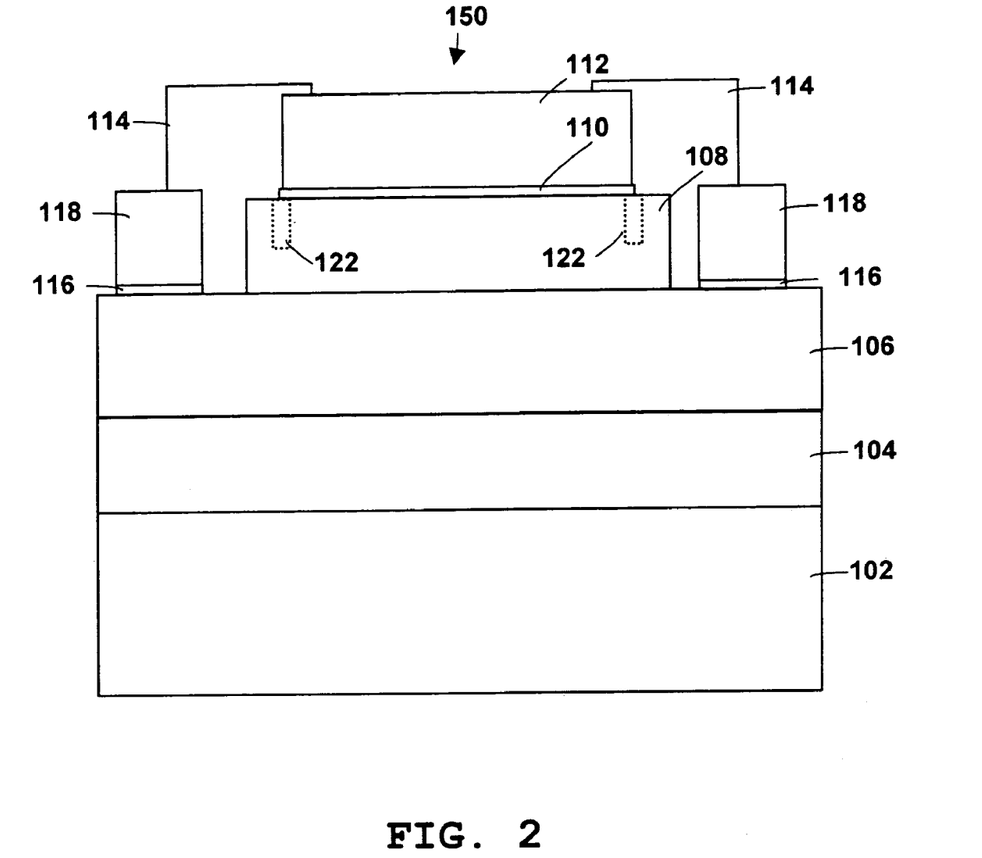
FIG. 2 is a fragmentary, diagrammatic cross-sectional view on an enlarged scale showing a laterally conducting Schottky diode in accordance with another embodiment of the invention.

FIG. 2 illustrates a cross-sectional view of a laterally conducting Schottky diode 150 in accordance with another embodiment of the invention. The structure of the Schottky diode 150 is similar to that of the Schottky diode 100 shown in FIG. 1 with like reference numerals representing like regions.

An ion implanted, but unactivated, guard ring 122 is formed within the layer 108 that is offset from the edge of the mesa by a predetermined distance, typically between 1 to 10 µm. The top of the guard ring layer 122 is located at or near the top of the semiconductor layer 108. The Schottky metal contact 110 and the bond pad metal layer 112 are of shorter length than the corresponding layers shown in FIG. 1 so that the edge of the Schottky metal contact is located over the guard ring or at the edge of the guard ring so that the guard ring minimizes the high electric fields present at the edge of the Schottky metal contact when the device 150 is reverse biased.

Figure 3A:
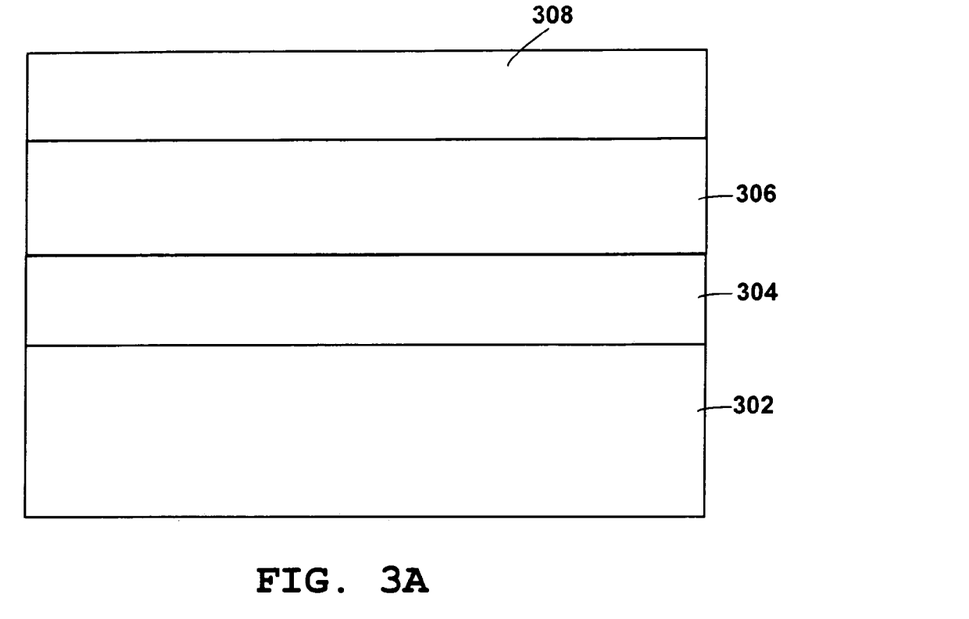
FIGS. 3A–3C are fragmentary, cross-sectional views on an enlarged scale illustrating the formation of a non-activated guard ring in a semiconductor layer structure according to a yet another embodiment of the invention.
Figure 3B:
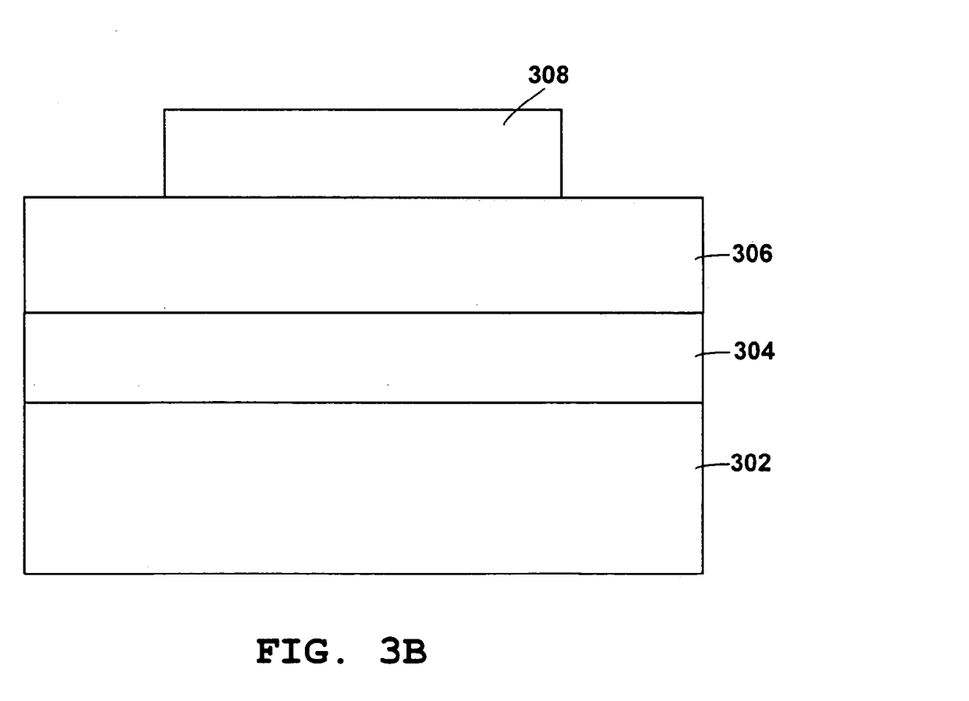
Figure 3C:
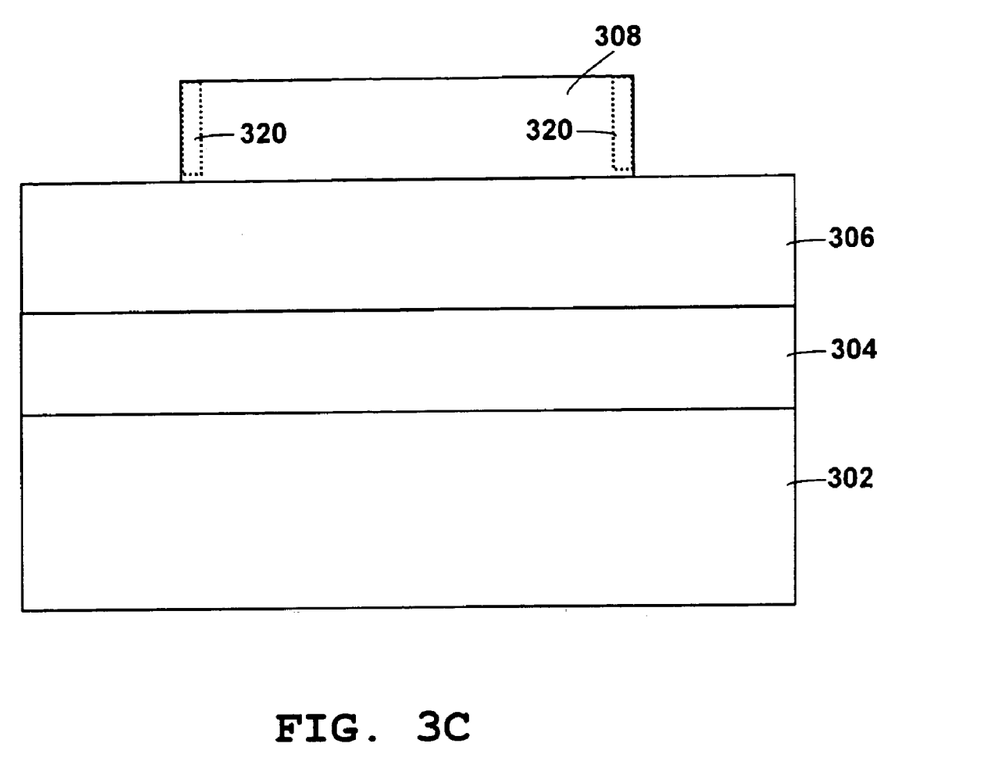

FIGS. 3A–3C illustrate steps in the formation of a guard ring in a semiconductor layer structure in accordance with a further embodiment of the invention. The process may be part of process for the formation of a laterally conducting Schottky diode, a vertically conducting Schottky diode, or another type of device which incorporates a Schottky barrier.

FIG. 3A illustrates a cross-sectional view of a semiconductor structure that is formed atop a substrate 302 upon which one or more further layers are formed. The substrate 302 ideally has a lattice spacing (the spacing between adjacent atoms in its crystal lattice) that is equal to or nearly equal to the lattice spacing of the semiconductor materials that are to be grown atop the substrate. This reduces the number of defects, such as dislocations in the crystal lattice, that are formed in the semiconductor. It is also highly desirable for the substrate to have a thermal expansion coefficient at least equal to that of the semiconductor material so that when the substrate and the semiconductor material are cooled after the growth of such semiconductor layers, the substrate will contract more than the semiconductor layers, thereby compressing the semiconductor layer and avoiding the formation of cracks in the layer.

When the substrate 302 is part of a laterally conducting Schottky diode, the substrate is typically an insulating or non-conducting substrate, such as a crystalline sapphire, silicon carbide or undoped silicon wafer. To compensate for the lattice mismatch and the thermal expansion coefficient mismatch between the semiconductor layers and the substrate, a buffer structure 304 may be provided atop the substrate 302. When the semiconductor material that is to be subsequently grown is a nitride-based semiconductor, such as gallium nitride (GaN) or a gallium nitride-based material, for example, the buffer layer may be comprised of one or more layers of nitride-based materials to provide a transition between the lattice structure of the substrate and the lattice structure of the gallium nitride or other nitride-based semiconductor layer.

When the substrate 302 is part of a vertically conducting Schottky diode, the substrate 302 is a doped substrate upon which is formed the buffer structure 304. When the substrate is a doped silicon wafer and the semiconductor material that is to be subsequently deposited is a nitride-based semiconductor, such as GaN or a GaN-based material, the buffer layer 304 may be a structure that includes a polycrystalline nucleation layer of a nitride semiconductor that overlies the top surface of the substrate 302 and one or more superlattices that are disposed atop the nucleation layer and which include one or more nitride-based semiconductors of different compositions. An aluminum layer may be deposited atop the silicon substrate prior to forming the nucleation layer. The formation of such a structure is described in U.S. Provisional Application No. 60/430,837, filed Dec. 4, 2002, and in U.S. application Ser. No. 10/721,488, filed Nov. 25, 2003, both titled "Gallium Nitride-Based Devices and Manufacturing Processes", the disclosures of which are incorporated herein by reference.

As used in the present disclosure, the term "III–V semiconductor" refers to a compound semiconductor material according to the stoichiometric formula $Al_a In_b Ga_c N_d As_e P_f$ where (a+b+c) is about 1 and (d+e+f) is also about 1. The term "nitride semiconductor" or "nitride-based semiconductor" refers to a III–V semiconductor in which d is 0.5 or more, most typically about 0.8 or more. Preferably, the semiconductor materials are pure nitride semiconductors, i.e., nitride semiconductors in which d is about 1.0. The term "gallium nitride based semiconductor" as used herein refers to a nitride semiconductor including gallium, and most preferably including gallium as the principal metal present, i.e., having $c \geq 0.5$ and most preferably $\geq 0.8$. The semiconductors may have p-type or n-type conductivity, which may be imparted by conventional dopants and may also result from the inherent conductivity type of the particular semiconductor material. For example, gallium nitride-based semiconductors having defects typically are inherently n-type even when undoped. Conventional electron donor dopants such as Si, Ge, S, and O, can be used to impart n-type conductivity to nitride semiconductors, whereas p-type nitride semiconductors may include conventional electron acceptor dopants such as Mg and Zn.

Next, a semiconductor layer 306 is formed atop the buffer structure 304 or, when the buffer structure is not present, directly atop the substrate 302. When the device formed is a Schottky diode, the semiconductor layer is a highly doped layer that is typically formed using an epitaxial growth process, such as reactive sputtering, metal organic chemical vapor definition (MOCVD), molecular beam epitaxy (MBE) or atomic layer epitaxy. When the device formed is another device that includes additional semiconductor device structures in addition to one or more Schottky junctions, the layer 306 may be include the additional semiconductor device structure.

When the highly doped semiconductor layer is a nitride-based semiconductor, such as GaN or a GaN-based semiconductor, and a reactive sputtering process is employed, the metallic constituents of the semiconductor, such as gallium, aluminum and/or indium, are dislodged from a metallic target disposed in close proximity to the substrate while both the target and the substrate are in a gaseous atmosphere that includes nitrogen and one or more dopants. Alternatively, when the highly doped layer 306 is a nitride-based semiconductor and MOCVD is used, the substrate is exposed to an atmosphere containing organic compounds of the metals as well as to a reactive nitrogen-containing gas, such as ammonia, and a dopant-containing gas. The substrate is maintained at an elevated temperature, typically around 700–1100° C., and the gaseous compound decompose and form a doped semiconductor in the form of a film of crystalline material on the surface of the substrate. The substrate and the grown film are then cooled. The resulting highly doped layer 106 is preferably n-type with a doping concentration of at least 4E18 $cm^{-3}$.

Then, a semiconductor contact layer 308 is formed. The semiconductor layer 308 is typically grown epitaxially using the methods described above, such as reactive sputtering, MOCVD, MBE or atomic layer epitaxy. The layer 108 may be grown as a doped layer by introduction of a dopant species in the manner described above or may be grown as an unintentionally doped layer that is doped by species removed from the reactor chamber walls and/or from the platters that hold the substrate.

When the semiconductor layer 308 is a nitride-based semiconductor, such as GaN or a GaN-based semiconductor, the semiconductor layer 308 is preferably n-type and preferably has a doping concentration of between 0.1E16 and 2E16 $cm^{-3}$. A modulation doping process may be used to attain such low doping levels in the nitride-based semiconductor layer in a repeatable and uniform manner. The description of such a modulation doping process is described in U.S. patent application Ser. No. 10/780,526, filed Feb. 17, 2004, the disclosure of which is incorporated herein by reference.

Next, as FIG. 3B shows, the semiconductor layer 308 is patterned using known photolithographic methods to expose one or more regions of the layer 308. The exposed part of the layer 308 is then etched away, such as using known reaction ion etching, other plasma etching, or wet etching methods, to expose the underlying higher doped layer 306 and form at least one mesa out of the layer 308. An upper portion of the exposed layer 306 may also be etched.

When the device formed is a vertically conducting Schottky diode, the patterning and etching steps of the semiconductor layer 308 may be omitted.

Then, as shown in FIG. 3C, a guard ring 320 is formed in the layer 308. The guard ring 320 is formed by one or more implants of at least one ion species into the layer 308 at the regions that are to form the guard ring. In contrast to known processes for forming a guard ring, the implanted region is preferably not annealed or, at most, is incompletely annealed during subsequent processing so that the implanted region is a high resistance region. Further, when the implanted species are dopant species, the implanted species are not activated. The guard ring 320 may be located at the edge of the mesa of the layer 308 or, alternatively, may be formed away from the edge of the mesa, typically 1 to 10 μm off the edge of the mesa.

The ion implantation may be preceded by the deposition and patterning of a masking layer, such as a resist mask layer, a dielectric mask layer, a gold mask layer, or other metal mask layer, that is formed atop the layer 308 as well as, optionally, atop the exposed higher doped layer 306. The patterned masking layer may expose regions at the edge of, the top surface of the mesa or region located from 1 to 10 μm away from the edge of the mesa. The ion species may then be implanted at a zero tilt angle with respect to the surface of layer 308. When the openings in the mask pattern expose the regions at the edge of the mesa, the openings may also expose adjoining regions of the higher doped layer 306. The resulting implant into the higher doped layer does not significantly affect the current carrying ability of the higher doped layer as long as the implant does not extend through the entire depth of the higher doped layer.

Alternatively, the resist deposition and patterning steps may be omitted, and the implanted regions formed at higher tilt angles, typically up to 14 degrees, so that the implanted species enter the layer 308 through the sidewalls of the mesa. When a guard ring at the edge of the mesa is desired, the ion implantation may be carried out at lower energies. Alternatively, when the guard ring is formed away from the edge of the mesa, higher implant energies may be required. The range of ion implant energies is typically between 10 to 400 keV.

When the layer 308 is a nitride-based semiconductor, such as GaN or a GaN-based semiconductor, the implanted ion species is preferably magnesium (Mg) or zinc (Zn). However, the implanted ion species may alternatively be one or more of the species that form the layer 308, such as nitrogen (N), or the ion species may be other Group III or Group V elements. As a further alternative, the implantation of other elements are also known to form high resistance regions, such as fluorine (F), oxygen (O), hydrogen (H), helium (He) or boron (B). The implant dose typically ranges from 5E12 to 1E16 $cm^{-2}$ but is preferably about 3.8E13 $cm^{-2}$.

When the ion species is implanted into the layer 308, the implanted species impacts the crystal lattice and creates defects by breaking the bonds between the atoms that form the layer 308. As an example, when the layer 308 is GaN, Ga—N bonds are broken by the implanted species. The defects create deep levels in the forbidden band of the semiconductor layer 308 which become traps for the conduction carriers and thereby decrease the number of carriers. As a result, the resistance of the implanted region increases. The defects remain in the semiconductor layer 308 throughout the remainder of the processing of the device because the structure is either not exposed to any subsequent high temperature annealing or is incompletely annealed to avoid recrystallizing the layer 308 and to retain the surface charge introduced by the implant step at the top surface of the semiconductor layer 308.

Thereafter, a high work function contact material (not shown) is formed atop the one or more mesas of the semiconductor contact layer 308 in a known manner and forms a metal-to-semiconductor rectifying junction with the layer 308. Preferably, the Schottky contact metal is first deposited atop the entire top surface of the mesa and is then patterned and etched whereby the pattern is aligned to the guard ring 320. When the layer 308 is a nitride-based semiconductor, such as GaN or a GaN-based semiconductor, the Schottky metal contact is typically comprised of a platinum (Pt) layer, a palladium (Pd) layer, or a nickel (Ni) layer.

When the device formed is a laterally conducting Schottky diode, an ohmic metal contact is formed atop the highly doped layer 306 at locations outside of and/or between the one or more mesas. When the higher doped semiconductor layer 306 is a nitride-based semiconductor, such as GaN or a GaN-based semiconductor, the ohmic metal contact is typically comprised of aluminum/titanium/platinum/gold (Al/Ti/Pt/Au) or titanium/aluminum/platinum/gold (Ti/Al/Pt/Au), though other combinations of metals may be used.

Alternatively, when the device formed is a vertically conducting Schottky diode, the ohmic metal contact is formed on the backside of the substrate 302.

As a further alternative, when the device formed is another device which incorporates one or more Schottky junctions, other process steps may follow.

Figure 4A:
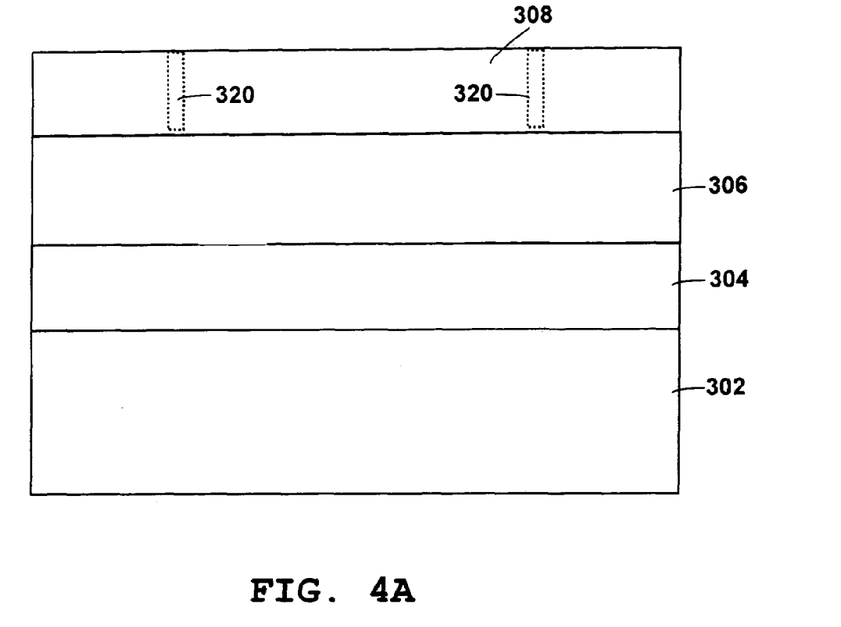
FIGS. 4A–4B are fragmentary, cross-sectional views on an enlarged scale illustrating the formation of a non-activated guard ring in a semiconductor layer structure according to still another embodiment of the invention.
Figure 4B:
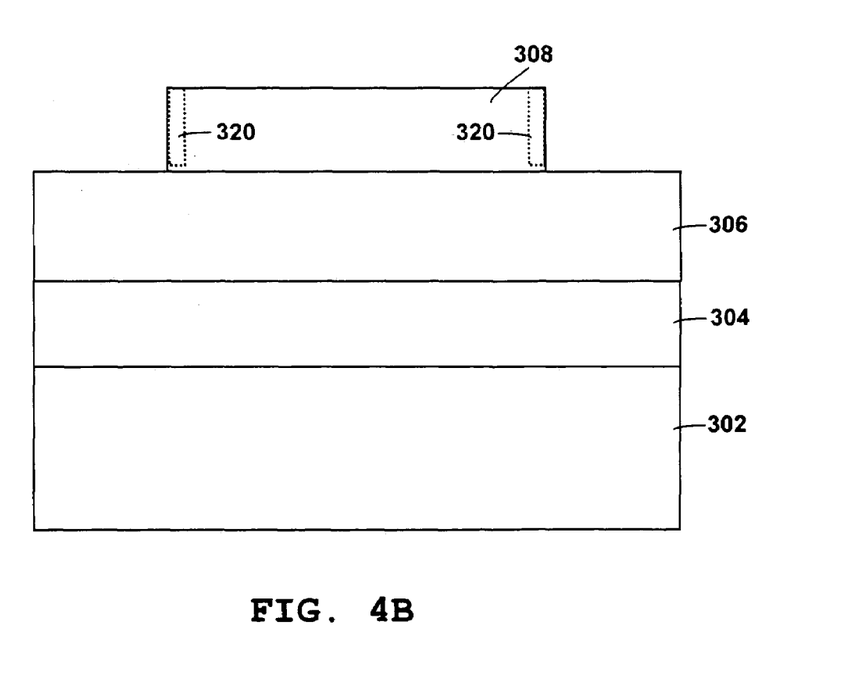

FIGS. 4A–4B illustrate the steps of an alternative embodiment of the invention in which the ion implantation that forms the guard ring precedes the etching of the top layer of the device.

FIG. 4A illustrates a cross-sectional view of a semiconductor structure that includes the substrate 302 upon which are formed the optional buffer 304, the higher doped semiconductor layer 306 and the semiconductor contact layer 308. The substrate 302 may be comprised of one of the materials described above with reference to FIG. 3A, and the buffer 304 and the layers 306 and 308 may likewise be formed in the manner described above.

After the formation of the semiconductor layer 308, the guard ring 320 is formed therein. As described above, the guard ring may be formed by implantation at a zero or low tilt angle through the top surface of the layer 308 using a patterned mask as described above. Alternatively, the implantation may be carried out through the sides of the mesa of the layer 308 without the use of a masking layer by implantation at a higher tilt angle and at higher energies. The implant may be carried out using the species, tilt angles, implant dose range and implant energy range described above with reference to FIG. 3C.

Next, as FIG. 4B shows, some or all of the portion of the layer 308 that is outside of the guard ring 320 is removed. Depending upon the number of guard rings formed by the ion implantation, one or more mesas may be formed out of the semiconductor layer 308. The portions of the layer 308 are removed using known patterning and etching methods, preferably using a masking pattern that is aligned to the guard ring 320 to form a lower contact region. Portions of the implanted region may also be removed, depending on the width of the implanted region. Further, an upper portion of the higher doped layer 306 that is beneath the removed regions of the layer 308 may also be removed.

Thereafter, a Schottky metal contact is formed atop the one or more mesas of the layer 308 in the manner described above. Additionally, when the device formed is a laterally conducting Schottky diode, an ohmic contact is formed atop one or more regions of the higher doped semiconductor layer 306, as described above, and when the device formed is a vertically conducting Schottky diode, the ohmic contact is formed on the backside of the substrate 302 also as described above. Alternatively, when the device formed is another device which incorporates one or more Schottky junctions, other process steps may follow.

Figure 5A:
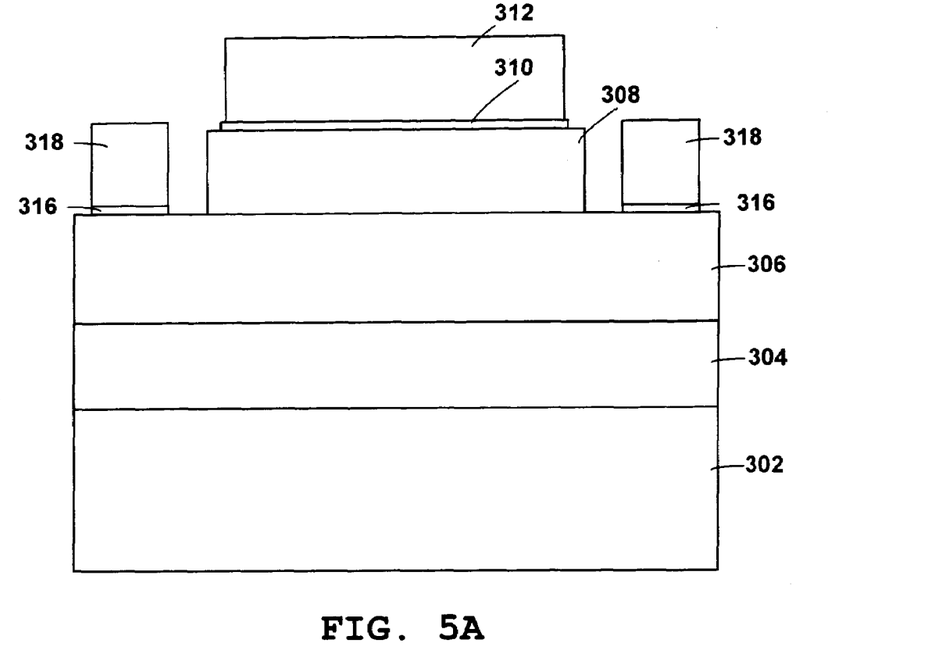
FIGS. 5A–5B are fragmentary, cross-sectional views on an enlarged scale illustrating the formation of a non-activated guard ring in a semiconductor layer structure according to yet another embodiment of the invention.
Figure 5B:
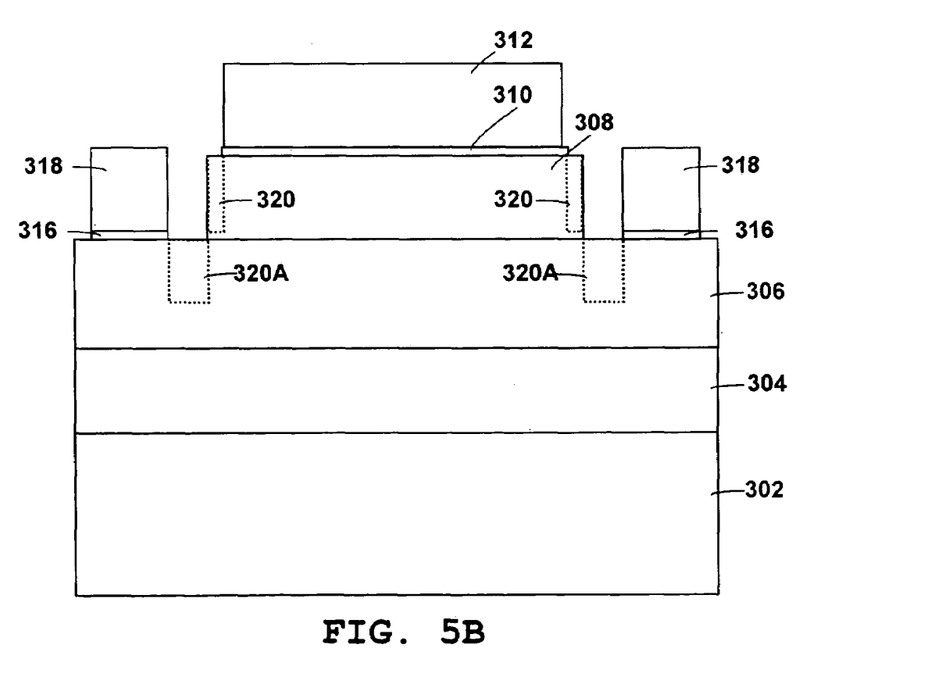

FIGS. 5A–5B illustrate the steps of a further alternative embodiment of the invention in which the ion implantation step that forms the guard ring is carried out after the formation of the Schottky metal contact and the formation of the ohmic metal contact.

FIG. 5A shows a cross-sectional view of a semiconductor structure that includes the above-described substrate 302, optional buffer 304, higher doped semiconductor layer 306 and semiconductor layer 308. The substrate 302 may be comprised of one of the materials described above with reference to FIG. 3A, and the buffer 304 and the layers 306 and 308 may likewise be formed in the manner described above. The semiconductor structure also includes a Schottky metal contact 310 that is formed atop the one or more mesas of the layer 308 in the manner described above as well as an ohmic contact 316 that is formed atop one or more regions of the higher doped semiconductor layer 306 in the manner described above. Bond pad metal layers 312 and 318 may also be formed at this time atop the Schottky metal contact 310 and the ohmic metal contact 316, respectively.

Then, as FIG. 5B illustrates, one or more ion species are implanted into the exposed regions of semiconductor layer 308 and the higher doped layer 306 including the regions located between the Schottky metal contact 310 and the ohmic metal contact 316. The one or more implant species are typically those described above with reference to FIGS. 3A–3C when the layer 308 is a nitride-based semiconductor, such as GaN or a GaN-based semiconductor. The implanted ions form a guard ring 320 in the layer 308. The width of the guard ring 320 extends from the edge of the Schottky metal contact 310 to the edge of the mesa of the layer 308, and the depth of the guard ring 320 extends downwards from the top surface of the layer 308 but does not extend through the entire depth of the layer. The ions are also implanted into a region of the higher doped layer 306 that extends between the edge of the mesa of the layer 308 and the ohmic metal contact 316 and forms an implanted region 320A. The thickness of the higher doped semiconductor layer 306 and/or the ion implant energy are selected such that the implanted region 320A does not extend down through the entire depth of the higher doped layer 306 to avoid having the implanted region 320A block the forward-biased current. The ion implant dose may also be selected to prevent such blocking of the forward-biased current.

Advantageously, the implanted region in the layer 308 is self-aligned to the Schottky metal contact 310 so that the guard ring 320 is likewise self-aligned to the edge of the Schottky metal contact as well as to the edge of the mesa of the layer 308. Additionally, the need for depositing and patterning an implant masking layer is also eliminated. Further, though a laterally conducting device is shown in FIG. 5A–5B, a guard ring may similarly be formed in the layer 308 of a vertically conducting device that is self-aligned to the edge of the Schottky metal contact and the edge of the top layer.

Figure 6:
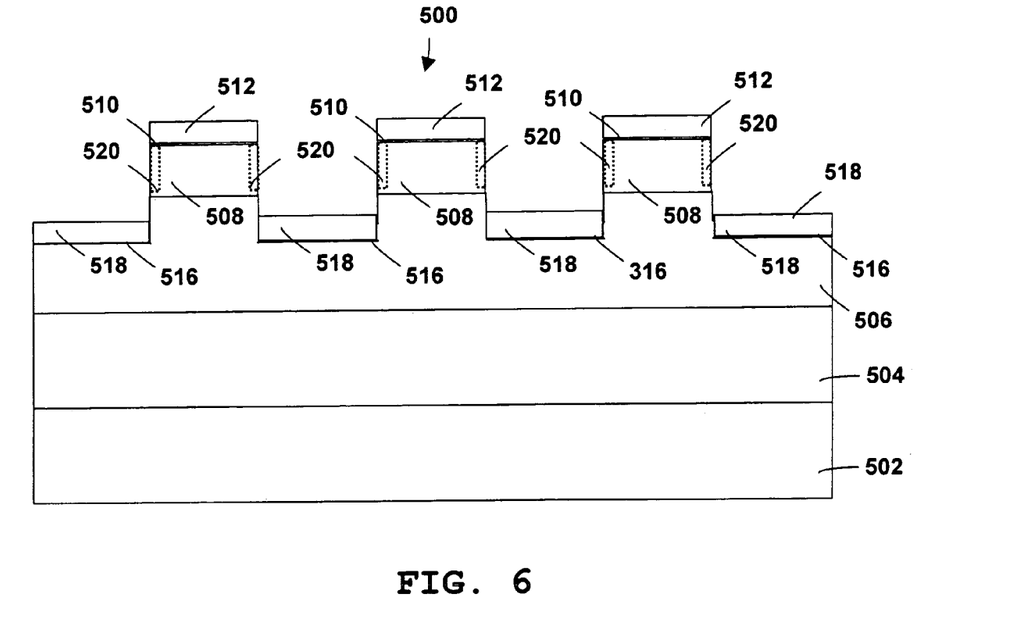
FIG. 6 is a fragmentary, cross-sectional view on an enlarged scale of a laterally conducting Schottky diode with plural mesas in accordance with a further aspect of the invention.

FIG. 6 shows a cross-sectional view of a laterally conducting Schottky diode 500 according to a further embodiment of the invention in which plural mesas are formed. The substrate 502, the optional buffer 504 and the higher doped layer 506 correspond to the substrate 102, buffer 104 and higher doped layer 106 shown in FIG. 1 and may be comprised of the same materials. A semiconductor contact layer 508, which may be comprised of the same material described above with reference to semiconductor contact layer 108 shown in FIG. 1, is etched to form plural mesas. An upper portion of the higher doped layer 506 may also be etched so that the remaining regions of the upper part of the higher doped layer form part of the mesa structure. A method of forming such a lateral conduction Schottky diode and its structure are also described in U.S. patent application Ser. No. 10/780,363, filed Feb. 17, 2004, the disclosure of which is incorporated herein by reference.

A Schottky metal contact 510 is disposed atop the mesas of the layer 508 with the edges of the Schottky metal contact being located atop the guard rings 520. A thicker bond pad metal layer 512 is located atop the Schottky metal contact 510.

An ohmic metal contact 516 is located atop the higher doped layer 506 between at least some of the mesas of the layer 508 and/or outside of the mesas. The ohmic metal contact may at least partially surround or completely surround some or all of the mesas. A bond pad metal layer 518 is formed atop the ohmic metal contact 516.

Guard rings 520 are disposed at or near the edges of the mesas of the semiconductor layer 508. The guard rings may be formed after etching of the layer 508, as described above with reference to FIGS. 3A–3C, before the etching of the layer, as described above with reference to FIGS. 4A–4B, or after the formation of Schottky metal contact and the ohmic metal contact, as described above with reference to FIGS. 5A–5B.

Figure 7:
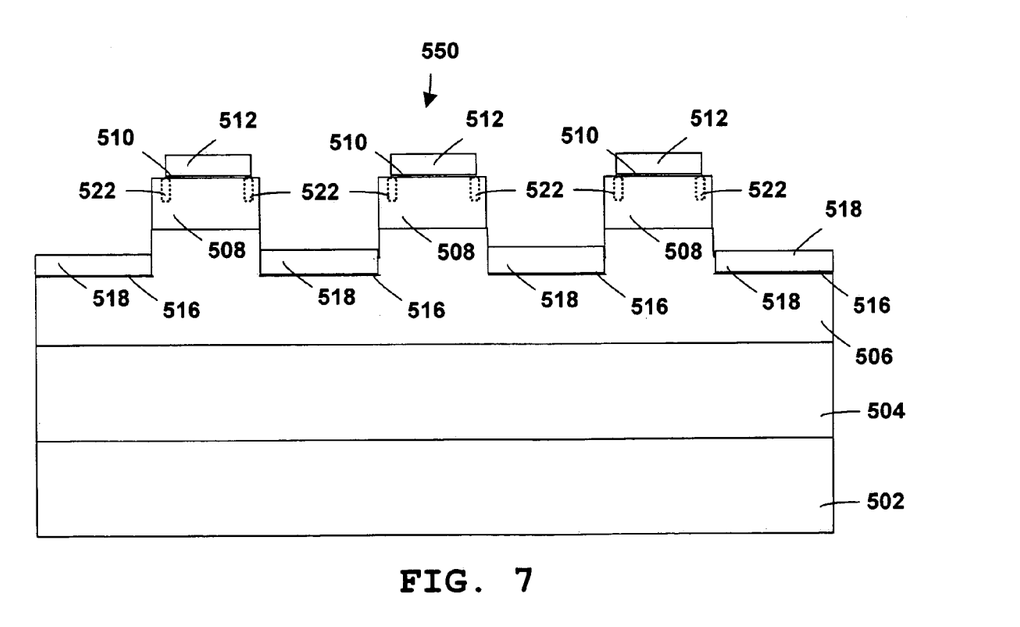
FIG. 7 is a fragmentary, cross-sectional view on an enlarged scale of a laterally conducting Schottky diode with plural mesas in accordance with a still further aspect of the invention.

FIG. 7 shows a cross-sectional view of a laterally conducting Schottky diode 550 in accordance with a still further aspect of the invention. The Schottky diode 550 has a structure similar to that shown above with reference to FIG. 6 with like reference numerals indicating like regions. However, guard rings 522 are formed away from the edge of the mesas of the semiconductor layer 508 in the manner described above with reference to FIGS. 3A–3C, FIGS. 4A–4B or FIGS. 5A–5B. The length of each Schottky contact 510 and each bond pad metal 512 that are disposed atop the mesas is reduced accordingly so that the Schottky metal contacts 510 are disposed atop part of the guard rings or the edges of the Schottky metal contacts 510 are aligned to or self-aligned to the guard rings.

Figure 8A:
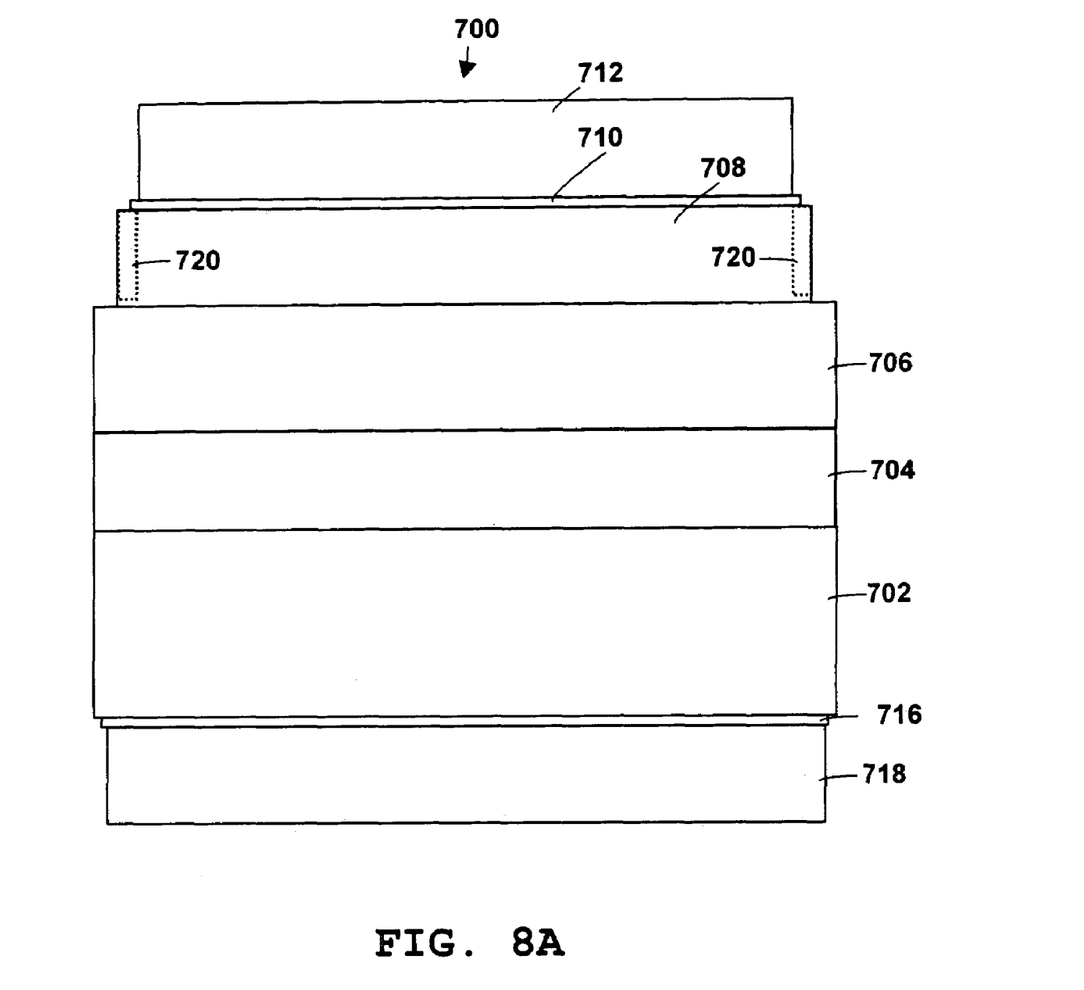
FIGS. 8A–8B are fragmentary, cross-sectional views on an enlarged scale showing vertically conducting Schottky diodes in accordance with other embodiments of the invention.
Figure 8B:
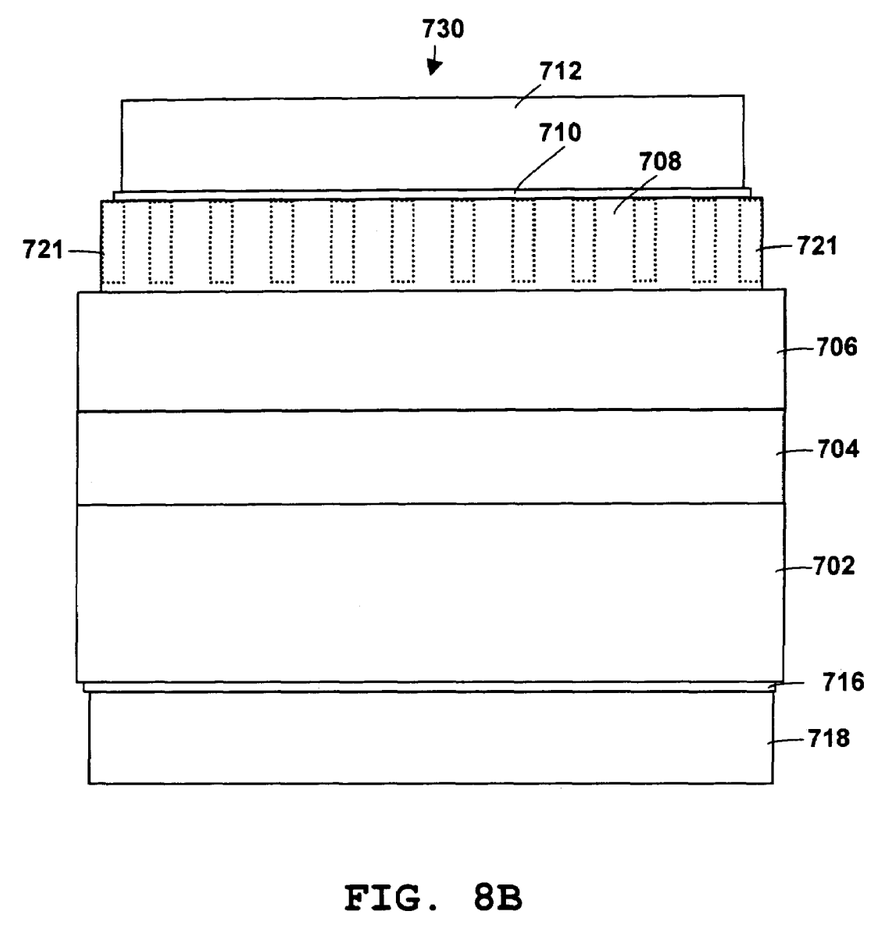

FIG. 8A illustrates a cross-sectional view of a vertically conducting Schottky diode 700 in accordance with another embodiment of the invention. The Schottky diode includes a conducting substrate 702 upon which an optional buffer structure 704, a highly doped semiconductor layer 706 and a semiconductor contact layer 708 are formed on the front side of the substrate 702 as described above with reference to FIG. 3A. The semiconductor layer 708 may be etched to form a mesa atop the higher doped semiconductor layer 706 or, alternatively, the layer 708 may have the same length as the higher doped semiconductor layer. A Schottky metallic contact 710 and a bond pad metal layer 712 are formed atop the semiconductor layer 708 such that the edge of the Schottky contact is disposed atop the guard ring 720. An ohmic metal contact 716 and a further bond pad metal 718 are formed on the backside of the substrate. A guard ring 720 is formed at the edge of the layer 708 in the manner described above with reference to FIGS. 3B–3C, 4A–4B or 5A–5B. Alternatively, FIG. 8B shows a Schottky diode 730 having a structure similar to that shown in FIG. 8A except that a plurality of guard rings 721 are formed in the layer 708 in the manner described above.

Figure 9A:
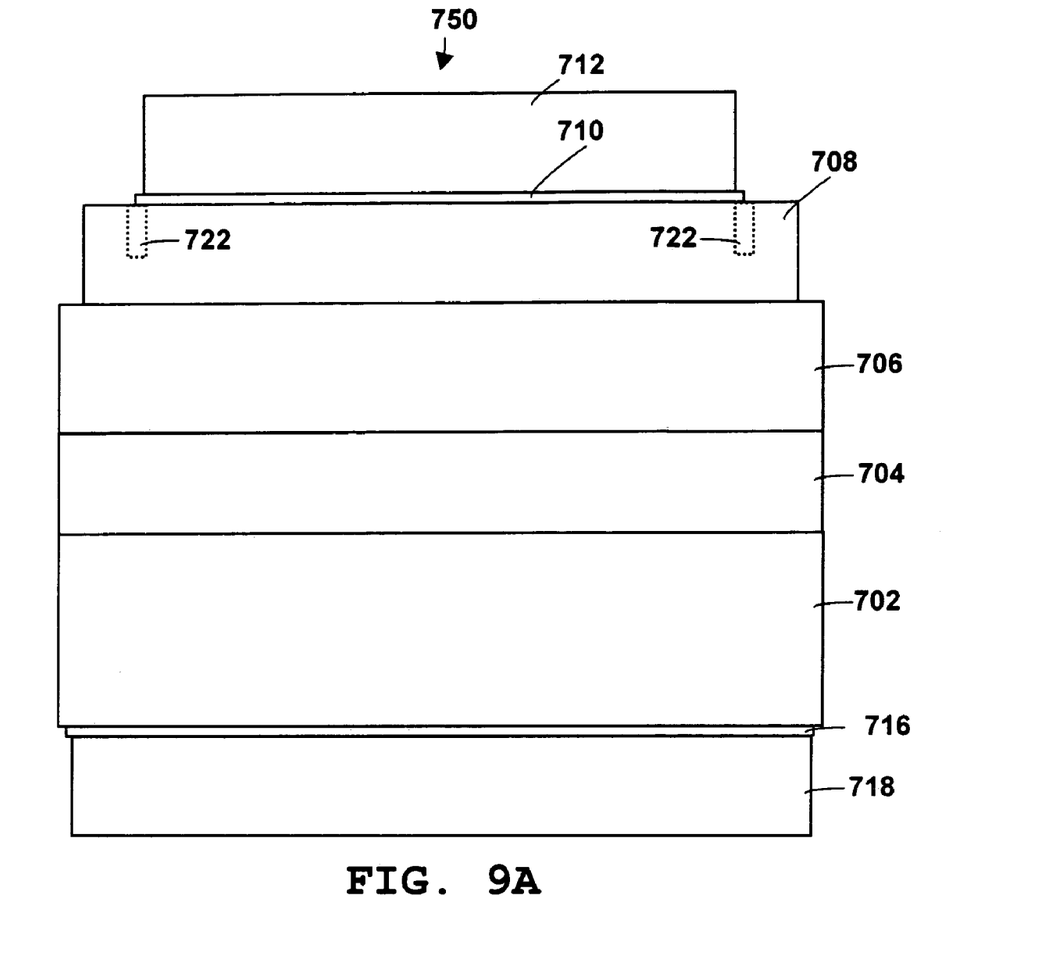
FIGS. 9A–9B are fragmentary, cross-sectional views on an enlarged scale showing vertically conducting Schottky diodes in accordance with still other embodiments of the invention.
Figure 9B:
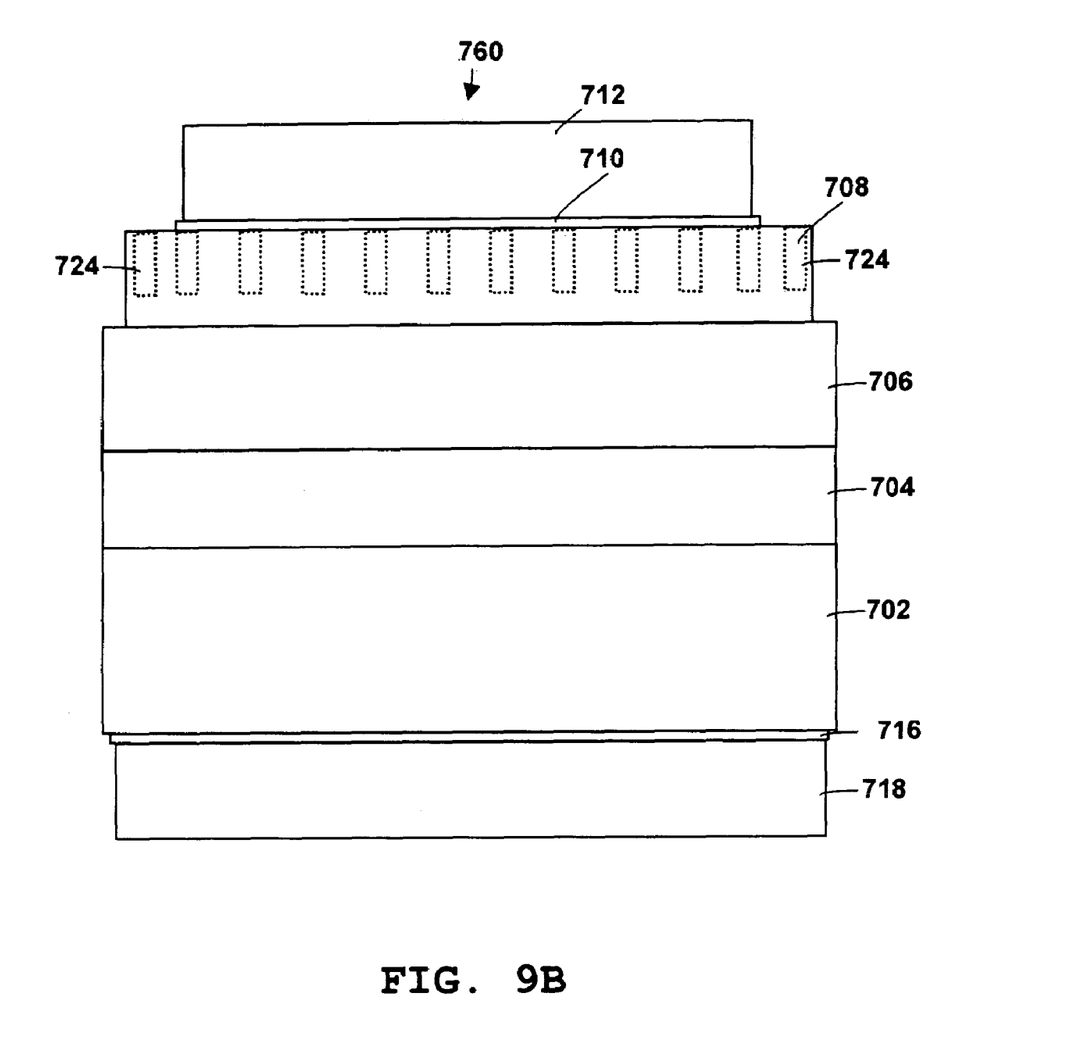

FIG. 9A shows a cross-sectional view of a vertical conduction Schottky diode 750 according to still another embodiment of the invention. The vertical conduction Schottky diode has a structure similar to that shown in FIG. 8A with like reference numerals referring to like regions. A guard ring 722 is formed at a distance from the edge of the semiconductor layer 708 in the manner described above with reference to FIGS. 3A–3C, 4A–4B or 5A–5B. The length of the Schottky metal contact 710 and the bond pad metal layer 712 are correspondingly reduced so that the Schottky metal contact 710 overlies part of the guard ring 722 or so that the edge of the Schottky metal contact is aligned to or self-aligned to the guard ring. FIG. 9B shows an alternative arrangement in which the Schottky diode 760 has a similar structure to that shown in FIG. 9A except that plural guard rings 724 are formed in the layer 708 in the manner described above.

Figure 10:
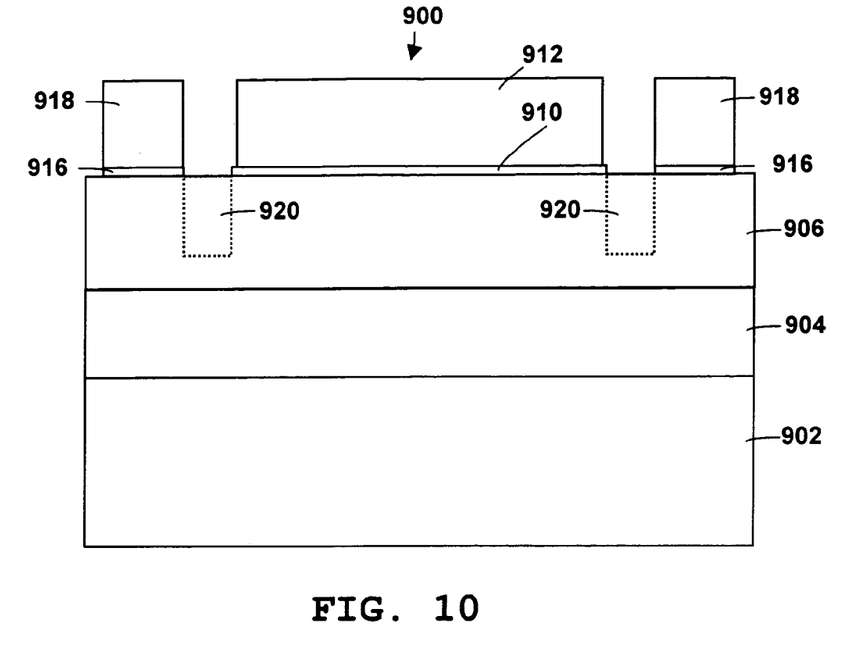
FIG. 10 is a fragmentary, cross-sectional view on an enlarged scale showing a laterally conducting Schottky diode having a planar structure in accordance with an additional aspect of the invention.

FIG. 10 illustrates a cross-sectional view of a lateral conduction Schottky diode according to an additional embodiment of the invention in which the top surface of the semiconductor body has a planar structure. The device includes an insulating substrate 902 and an optional buffer 904 which correspond to the substrate 102 and the buffer 104 shown in FIG. 1 and which may be comprised of the same materials. A semiconductor layer 906, which may be the same as the layer 106 described above with reference to FIG. 1, is disposed atop the substrate 902 and/or the buffer 904. A Schottky metal contact 910 is disposed atop one or more regions of the layer 906, and an ohmic metal contact 916 is formed atop one or more further regions of the layer 906. Because both the Schottky metal contact and the ohmic metal contact are disposed atop the same semiconductor layer, the junction properties of the contact are determined by the metals selected to form the Schottky metal contact and the ohmic metal contact.

A guard ring 920 is disposed within the doped semiconductor layer 906 and extends between the edges of the Schottky metal contact 910 and the ohmic metal contact 916. The guard ring may be formed before the formation of the Schottky metal contact and the ohmic metal contact, as described above with references to FIGS. 4A–4B, but is preferably formed after the formation of the Schottky metal and ohmic metal contacts, as described above with reference to FIGS. 5A–5B, so that the guard ring 920 is self-aligned to the Schottky metal and ohmic metal contacts. The guard ring 920 also extends downward from the top surface of the doped layer 906 but only partially through the layer 906 to avoid blocking the forward-biased current.

Figure 11:
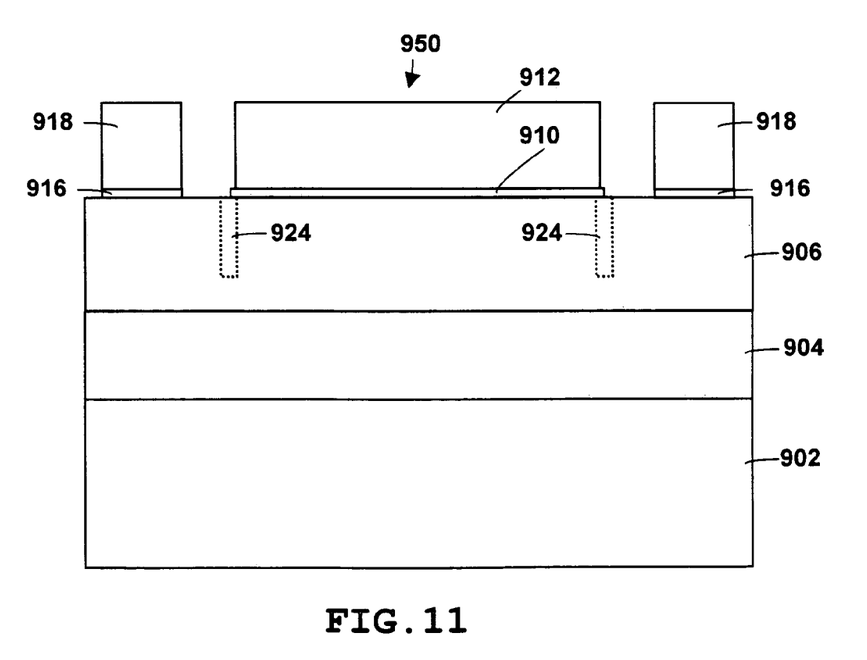
FIG. 11 is a fragmentary, cross-sectional view on an enlarged scale of a laterally conducting Schottky diode having a planar structure in accordance with a still additional aspect of the invention.

FIG. 11 shows a cross-sectional view of a laterally conducting, planar Schottky diode in accordance with a still additional aspect of the invention. The Schottky diode has a structure similar to that shown above with reference to FIG. 10 with like reference numerals indicating like regions. However, a guard ring 924 is located within the doped semiconductor layer 906 and only extends several microns outside of the edge of the Schottky metal contact 910, rather than extending along the entire region between the Schottky metal and ohmic metal contacts as shown in FIG. 10. A portion of the guard ring 924 may also extend beneath the ohmic metal contact 910. The guard ring 924 is preferably formed before the formation of the Schottky metal and ohmic metal contacts as described above with reference to FIG. 4A–4B. Alternatively, the guard ring may be formed after the formation of the Schottky metal and ohmic metal contacts using a masking layer that restricts the implant into only a portion of the region between the Schottky metal and ohmic metal contacts but which, preferably, is still self-aligned to the Schottky metal contact.

Advantageously, the present invention provides a guard ring that improves the breakdown voltage characteristics of the Schottky diode or other device having a Schottky barrier, as well as lowering the leakage current of such devices. Because the guard ring is formed by ion implantation and is either not annealed or is incompletely annealed, charge at the top surface of the semiconductor contact layer remains and improves the characteristics of the device.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention climed is:

1. A method of forming a guard ring in a semiconductor structure, said method comprising:
    providing a semiconductor body including a contact layer;
    implanting at least one ion species into at least one portion of said contact layer to form at least one implanted region therein, said at least one implanted region being disposed at least adjacent to a portion of a surface of said contact layer upon which an edge of a Schottky metallic contact is disposed or is to be disposed; and
    subsequently processing said semiconductor body without annealing said implanted region.

2. A Schottky diode formed by a method including forming a guard ring as claimed in claim 1, wherein said step of providing a semiconductor body includes the step of forming at least one semiconductor layer on a surface of a substrate, said semiconductor layer at least including said contact layer, whereby said semiconductor body includes said substrate and said at least one semiconductor layer; said method further comprising
    forming the Schottky metallic contact atop at least part of said contact layer to form a Schottky junction therewith.

3. A Schottky diode formed by a method as claimed in claim 2 further comprising forming at least one further metallic contact on said contact layer in substantially ohmic contact therewith.

4. A Schottky diode formed by a method as claimed in claim 2 further comprising patterning and etching at least one region of said semiconductor layer prior to forming said metallic contact to define at least one further surface in said semiconductor body and at lease one mesa, said mesa projecting upwardly from said further surface and at least including said contact layer, said Schottky junction being disposed atop said mesa.

5. A Schottky diode formed by a method as claimed in claim 4 wherein said patterning and etching step is carried out prior to implanting said ion species.

6. A Schottky diode formed by a method as claimed in claim 4 wherein said further surface of said semiconductor body is a lower contact surface, and said method includes forming at least one further metallic contact on said lower contact surface in substantially ohmic contact therewith.

7. A Schottky diode formed by a method as claimed in claim 4 wherein said patterning and etching step included patterning and etching one or more regions of said semiconductor body to define a plurality of mesas projecting upwardly from said further surface, at least some of said plurality of mesas each including at least one or said one or more guard rings.

8. A Schottky diode formed by a method as claimed in claim 2 wherein said substrate is an electrically insulating material.

9. A Schottky diode formed by a method as claimed in claim 2 wherein said substrate is a semiconductor, said method further including forming at least one further metallic contact on another surface of said substrate in substantially ohmic contact therewith.

10. A Schottky diode formed by a method including forming a guard ring as claimed in claim 1, wherein said step of providing a semiconductor body includes the step of forming at least one semiconductor layer on a surface of a substrate, said semiconductor layer at least including said contact layer, whereby said semiconductor body includes said substrate and said at least one semiconductor layer; said method further comprising forming a metallic contact atop at least part of said contact layer to form a Schottky junction therewith prior to implanting said at least one ion species, said metallic contact masking said implanting of said at least one ion species such that said implanted region is self aligned to said metallic contact.

11. A Schottky diode formed by a method as claimed in claim 10 further comprising forming at least one further metallic contact on said semiconductor layer in substantially ohmic contact therewith prior to implanting said at least one ion species, said ohmic contact further masking said implanting of said at least one ion species.

12. A Schottky diode formed by a method as claimed in claim 10 further comprising patterning and etching at least one region of said semiconductor layer prior to forming said metallic contact to define at least one lower contact surface in said semiconductor body and at least one mesa, said mesa projecting upwardly from said further surface and at least including said doped region, said Schottky metallic contact being formed atop said mesa, and forming at least one further metallic contact on said lower contact surface in substantially ohmic contact therewith prior to implanting said at least one ion species, said ohmic contact further masking said implanting of said at least one ion species.

* * * * *